United States Patent [19]

Saeki et al.

[11] Patent Number: 5,130,784
[45] Date of Patent: Jul. 14, 1992

[54] SEMICONDUCTOR DEVICE INCLUDING A METALLIC CONDUCTOR FOR PREVENTING ARCING UPON FAILURE

[75] Inventors: Shuzo Saeki, Yokohama; Makoto Hideshima, Tokyo, both of Japan

[73] Assignee: Kabushiki Kaisha Toshiba, Kawasaki, Japan

[21] Appl. No.: 617,275

[22] Filed: Nov. 23, 1990

Related U.S. Application Data

[63] Continuation of Ser. No. 332,132, Apr. 3, 1989, abandoned.

[30] Foreign Application Priority Data

Apr. 5, 1988 [JP] Japan .................. 63-82339

[51] Int. Cl.⁵ .......... H01L 23/42; H01L 23/44; H01L 23/46; H01L 27/02
[52] U.S. Cl. ................. 357/79; 357/46
[58] Field of Search ................. 357/79, 46

[56] References Cited

U.S. PATENT DOCUMENTS

| | | | |
|---|---|---|---|
| 4,009,485 | 2/1977 | Koenig | 357/68 |
| 4,047,197 | 9/1977 | Schierz | 357/81 |
| B1 4,047,197 | 3/1985 | Schierz | 357/81 |
| 4,314,270 | 2/1982 | Iwatani | 357/75 |
| 4,518,982 | 5/1985 | Du Bois et al. | 357/74 |
| 4,945,396 | 7/1990 | Shigekane et al. | 357/46 |

*Primary Examiner*—Andrew J. James
*Assistant Examiner*—Stephen D. Meier
*Attorney, Agent, or Firm*—Finnegan, Henderson, Farabow, Garrett and Dunner

[57] ABSTRACT

A semiconductor device includes a metallic electrode formed on a semiconductor substrate, and a metallic terminal formed on a metal base through an insulating material, in parallel to the metal electrode. A metallic wire electrically connects the metallic electrode to the metallic terminal. In a metallic conductor having a current capacity larger than that of the metallic wire, one end is in contact with the metallic terminal, and the other end is in contact with the metallic electrode.

5 Claims, 4 Drawing Sheets

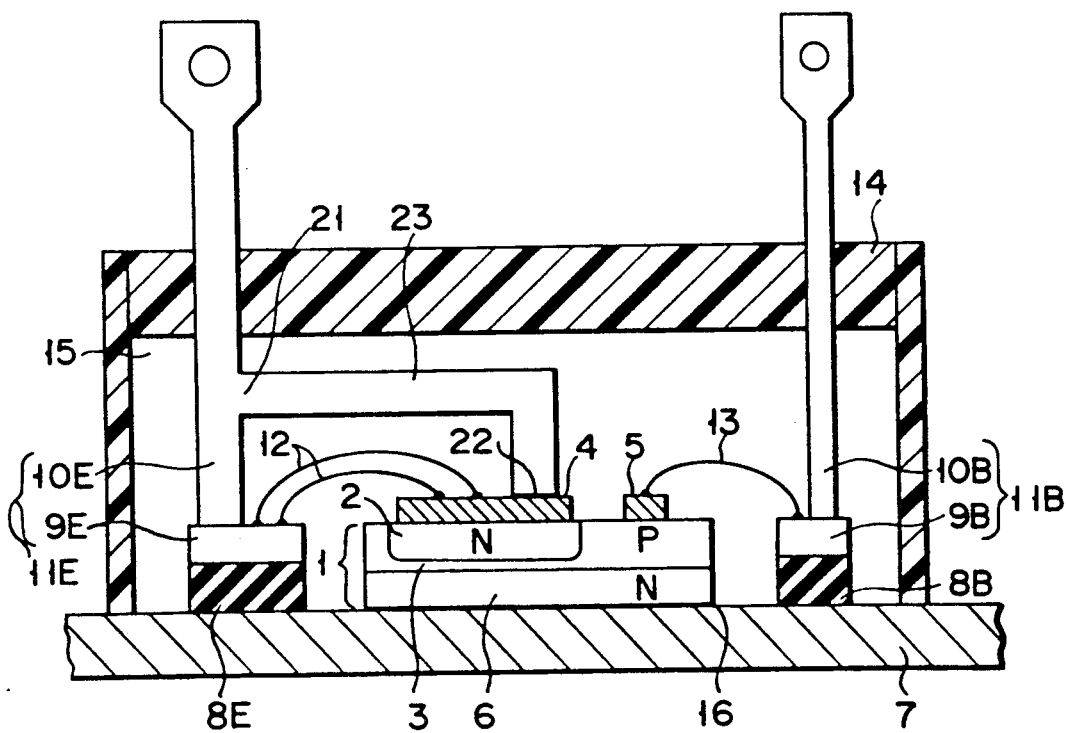
F I G. 2

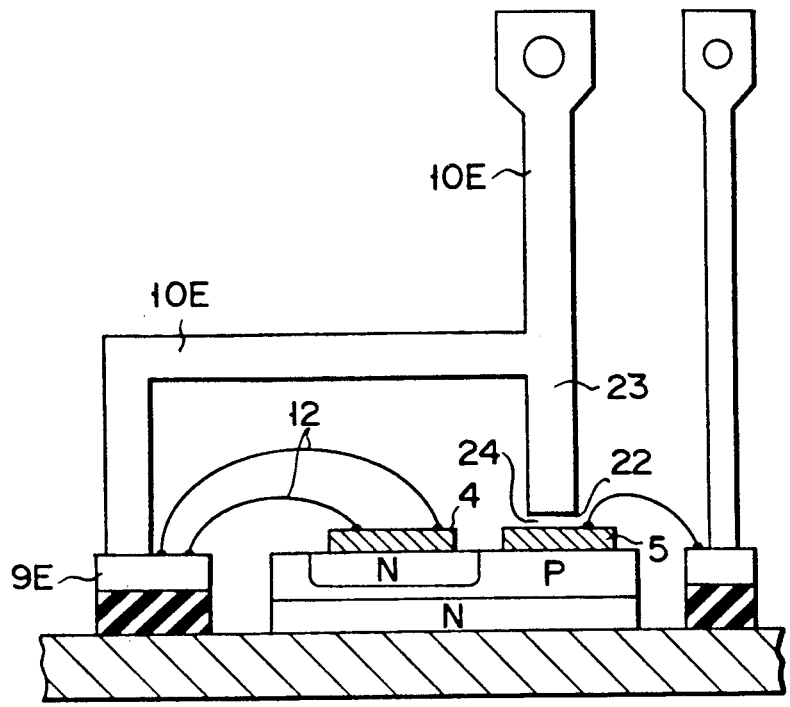
F I G. 5
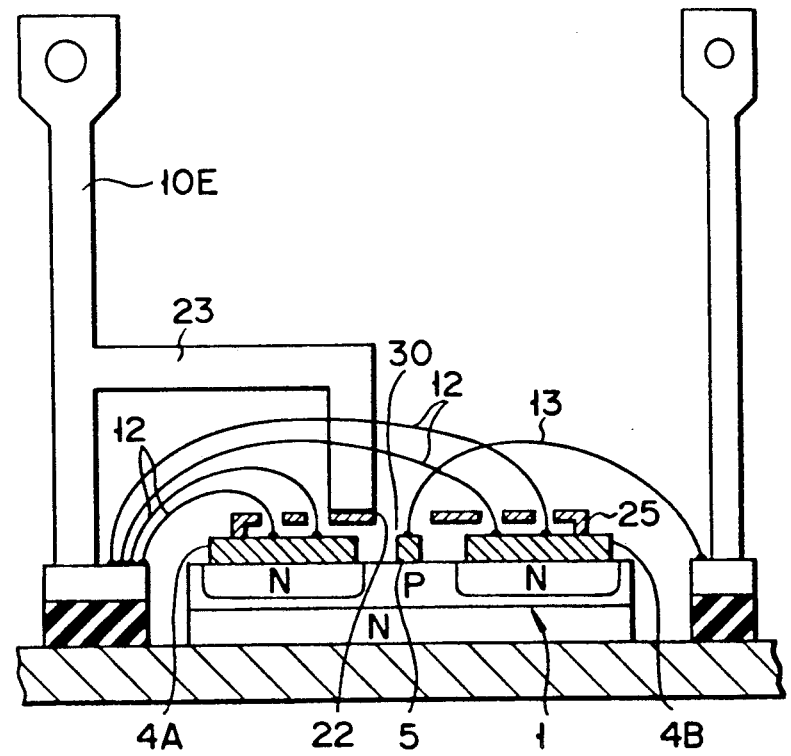
F I G. 6

SEMICONDUCTOR DEVICE INCLUDING A METALLIC CONDUCTOR FOR PREVENTING ARCING UPON FAILURE

This application is a continuation of U.S. patent application Ser. No. 07/332,132, filed Apr. 3, 1989 now abandoned.

BACKGROUND OF THE INVENTION

1. Field of the Invention

The present invention mainly relates to a power semiconductor device and, more particularly, to a semiconductor device which can prevent arc generation, damage of a case, and the like when a failure occurs.

2. Description of the Related Art

The power semiconductor device includes a device in which one element is mounted on one semiconductor substrate, and a device in which a plurality of elements are mounted on one semiconductor substrate. A prior art power semiconductor device will be described hereinafter, exemplifying a power n-p-n transistor which belongs to the former type of device.

FIG. 1 is a typical sectional view of the conventional transistor. An emitter layer 2 and a base layer 3 are formed on one surface of a semiconductor substrate 1. An Al emitter electrode 4 and an Al base electrode 5 are formed on the surfaces of the layers 2 and 3, respectively. An n-type collector layer 6 is formed on the other surface of the substrate 1, and the collector is soldered to a Cu base 7.

A metallic emitter terminal 11E consisting of an emitter terminal block 9E and an external emitter terminal 10E connected to the terminal block 9E is formed on the Cu base 7 through an insulating material 8E. Similarly, a metallic base terminal 11B consisting of a base terminal block 9B and an external base terminal 10B connected to the terminal block 9B is formed on the Cu base 7 through an insulating material 8B.

The emitter electrode 4 and the emitter terminal block 9E, and the base electrode 5 and the base terminal block 9B are connected by Al wires 12 and 13, respectively, by means of ultrasonic welding. The entire transistor is covered by a plastic case 14, and an internal space 15 of the case is filled with a resin. In this transistor, the emitter electrode 4 is connected to the metallic terminal 11E via the metallic wire 12. When an excessive current flows upon failure, the wire 12 is fused. Alternatively, when an excessive current flows upon failure, a bonding portion between the metallic wire and the electrode on the semiconductor substrate, or between the metallic wire and the metallic terminal is separated. If a voltage of 100 V or more is applied to this portion, an arc is generated and the metallic wire is easily fused.

When the metallic wire is fused due to flow of an excessive current, and a voltage of 100 V or more is applied to the fused portion, an arc is generated. The temperature in the case is extremely increased and the case is scattered. Not only this semiconductor device, but also circuit portions around the device may be damaged.

In order to prevent the above problem, an attempt has been made to increase the cross-sectional area of the metallic wire as much as possible. However, the thickness of the wire which allows reliable connection by ultrasonic-welding is limited. More specifically, in the case of an Al wire, its diameter can be increased only within 500 μm.

It may be proposed to connect a thicker wire by, e.g., soldering. However, in the case of an Al±electrode, it is difficult to perform soldering.

Even if a plurality of metallic wires are connected in parallel, a current capacity for an excessive current upon failure is not always increased in proportion to the number of wires, and the current capacity is limited. In addition, an improved high power semiconductor device wherein semiconductor chips are coupled to terminals via bonding wires is disclosed in U.S. Pat. No. 4,518,982, as another prior art.

The power transistor has been described above as a prior art. However, even if another power semiconductor device in which a metallic terminal is connected to a metallic electrode via a wire, and an excessive current exceeding a fusing current flows through the metallic wire upon failure is used, the above-described phenomena, i.e., arc generation and damage of the case occur upon failure.

In view of this problem, a semiconductor rectifier which has a p-n junction is fastened with its connecting component to one side of a common metallic base plate is described in U.S. Pat. No. 4,047,197 as a prior art. In this prior art, a metallic wire is not used and the above disadvantages of the metallic wire can be avoided.

The connection between the metallic base plate and the connecting component, however, allows formation of a current path. Therefore, the step of soldering or the like is provided in order to achieve reliable electrical contact. For this reason, processing precision is degraded, and a range of metal selection is limited.

SUMMARY OF THE INVENTION

The present invention has been made in consideration of the above situation, and has as its object to provide a semiconductor device which can prevent generation of arc and damage of a case upon failure while providing advantages obtained by using a metallic wire, e.g., keeping of the uniformity of chips, enlargement of a safe operation region, and easy fine processing.

In order to achieve the above object, the semiconductor device according to the present invention comprises: a metal base; a semiconductor substrate provided on said metal base and for forming a semiconductor element region; a metallic electrode formed on the semiconductor substrate; a metallic terminal disposed on an insulating material on a surface of the metal base; and a metallic conductor one end of which is connected to the metallic terminal, the other end of which is in contact with or adjacent to the metallic electrode, and which has a current capacity larger than that of the metallic wire. With the above arrangement, the semiconductor device according to the present invention can keep advantages obtained by using a metallic wire. In addition, since the electrical contact between the metallic conductor and metallic electrode is not achieved in order to flow an excessive current in a normal state, i.e., noresistance state, the metallic conductor may be simply in contact with or adjacent to the metallic electrode, and the processing precision may not be degraded. Since the metallic wire is used, fine processing can be performed and electrodes can be formed throughout the chip. Therefore, high-speed switching operation can be realized.

In addition, even if an excessive current flows through the metallic conductor upon failure and the metallic wire in a case is fused or disconnected, generation of a large arc can be prevented, and scattering of the case can be prevented. Therefore, not only the damage of other circuit components can be prevented, but also a quick-acting fuse for operating in a short time period is unnecessary in circuit design. Therefore, the circuit components can be protected by a normal current breaker, and hence a small circuit can be effectively realized at a low cost.

BRIEF DESCRIPTION OF THE DRAWINGS

FIG. 2 is a typical sectional view showing a semiconductor device according to an embodiment of the present invention; and FIGS. 3 to 8 are typical sectional views showing the semiconductor device according to other embodiments of the present invention.

DETAILED DESCRIPTION OF THE PREFERRED EMBODIMENTS

Figure 1:
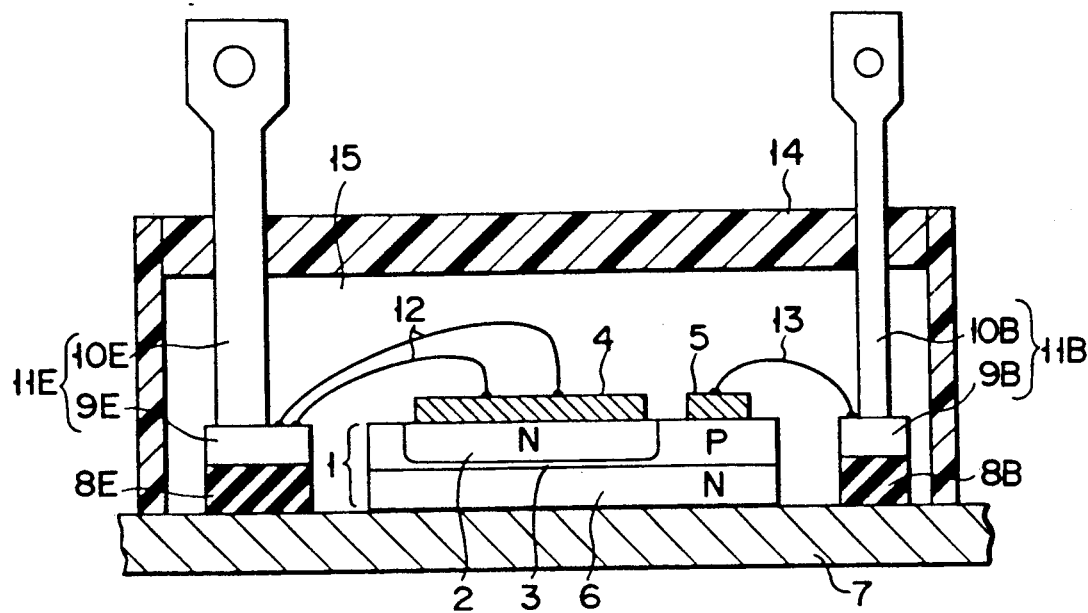
FIG. 1 is a sectional view showing an arrangement of a conventional semiconductor device.

The present invention will be described below in detail based on embodiments. FIGS. 2 to 8 are typical sectional views of a power bipolar transistor exemplified as embodiments of the present invention. The same reference numerals in FIGS. 2 to 8 denote the same parts or the corresponding parts. Although a case (surrounding container) is not shown in FIGS. 3 to 6, substantially the same one as in the other embodiments is also used in FIGS. 3 to 6.

A semiconductor device shown in FIG. 2 according to a first embodiment of the present invention is a transistor which comprises a semiconductor substrate 1 having an Al emitter electrode 4 and an Al base electrode 5 on its one surface, a metallic emitter terminal 11E and a metallic base terminal 11B which are electrically insulated with the semiconductor substrate 1 by insulating materials 8E and 8B, respectively, and Al wires 12 and 13 for electrically connecting a terminal block 9E of the metallic emitter terminal 11E to the Al emitter electrode 4, and for electrically connecting a terminal block 9B of the metallic base terminal 11B to the Al base electrode 5, respectively. In addition, the transistor includes a metallic conductor 23 having a current capacity larger than that of the Al wire 12 in the emitter side, one end 21 of which is electrically connected to an external terminal 10E of the metallic emitter terminal 11E, and the other end 22 of which is in contact with the Al emitter electrode 4. Note that the metallic emitter terminal 11E consists of the terminal block 9E and the external terminal 10E. The Al emitter and Al base electrodes 4 and 5 are respectively in ohmic contact with an n-type emitter layer 2 and p-type base layer 3 which are formed on one surface of the semiconductor substrate 1. An n-type collector layer 6 is formed on the other surface of the substrate 1, and the collector layer 6 is soldered to a Cu base 7 through a soldered portion 16. The entire transistor is covered with a plastic case 14, and an internal space 15 of the case is filled with a resin (when a metallic case is employed, an $N_2$ gas or the like is often hermetically sealed).

In this embodiment, an Al wire having a diameter of 500 μm and a fusing current of 490 A is used as the metallic wire 12, and a Cu strip having a sectional area of 1 mm$^2$ and a fusing current of 3,560 A is used as the metallic conductor 23. In general, the current capacity of the metallic conductor 23 is preferably twice or more that of the metallic wire for each metallic wire.

In the transistor having the above arrangement, a normal emitter current flows through the metallic wire 12. Therefore, bonding between the other end 22 of the metallic conductor 23 and the A( emitter electrode 4 does not always require high reliability. For example, when a contact is achieved by urging, an urging means need only keep light contact. Even if the metallic wire 12 is fused due to flow of an excessive current upon failure, and a voltage of, e.g., 100 V or more is applied between the metallic emitter terminal 11E and the Al emitter electrode 4, the excessive current immediately flows through the metallic conductor 23, and the voltage between the fused portions is considerably reduced, thus preventing formation of a large arc which may damage the case.

The present invention is not limited to the construction shown in FIG. 2; it may have the construction described below. In the description below, the same reference numerals as in FIG. 2 will be used for denoting similar parts or structural elements. Although not shown, an insulating material is laid over Cu base 7, and metallic emitter terminal 11E is provided on the insulating material. Semiconductor substrate 1 is mounted on the insulating material, with the same material as those emitter and base terminal blocks 9E and 9B interposed, such that substrate 1 is located on the side of metallic emitter terminal 11E. In this fashion, Cu base 7 is insulated from semiconductor substrate 1. The outer terminal of the collector layer 6 is connected to the insulating material and is led upward, as in the cases of outer terminal 11E (FIG. 2) of the emitter and outer terminal 11B of the base. If necessary, Cu base 7 may be omitted from this alternative construction.

Figure 3:
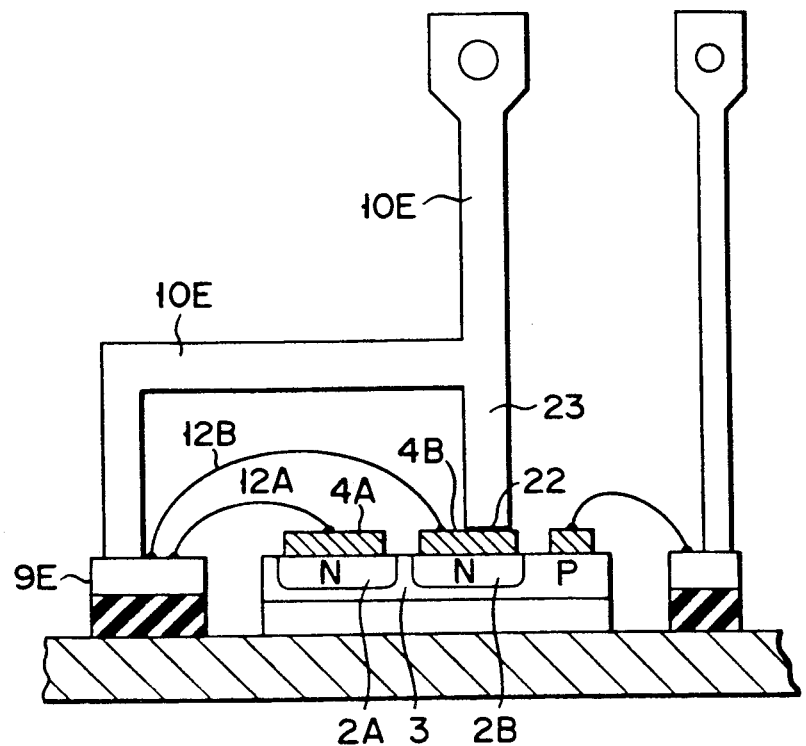

FIG. 3 shows a second embodiment of the present invention. An n-type emitter layer 2 in the first embodiment is separated into emitter layers 2A and 2B, and an Al emitter electrode 4 is also separated into Al emitter electrodes 4A and 4B. An Al wire 12 to be connected to the above electrodes is also separated into Al wires 12A and 12B, and the separated wires 12A and 12B are connected to a terminal block 9E. The other end 22 of a metallic conductor 23 is placed on one electrode 4B. Note that an external emitter terminal 10E and the metallic conductor 23 are integrally made from a single metallic plate by pressing, and often have a continuous boundary therebetween.

In this transistor, even if the Al wire 12A is fused due to an excessive current upon failure, since the n-type emitter layers 2A and 2B are formed next to each other in a p-type base layer 3, the excessive current flows through the metallic conductor 23 via the n-type emitter layer 2B and the Al emitter electrode 4B. Therefore, the transistor in this embodiment can obtain substantially the same function and effect as those in the first embodiment. In this case, even if the Al wire 12B is not fused, since the electric resistance of the metallic conductor 23 is smaller than that of the Al wire 12B, the excessive current flows through the metallic conductor 23.

Figure 4:
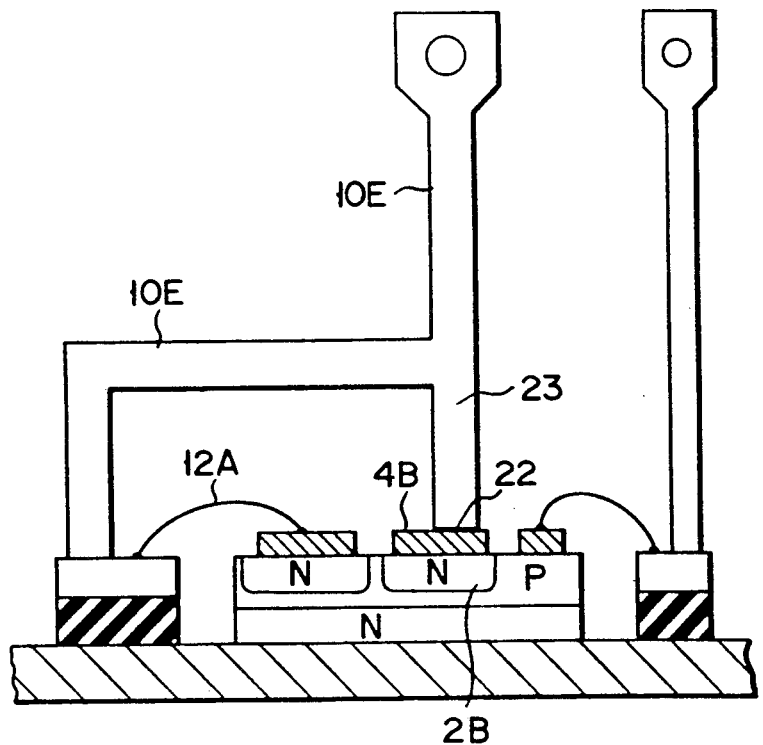

FIG. 4 shows a third embodiment of the present invention. FIG. 4 shows a transistor wherein a metallic wire is not connected to an emitter electrode 4B in contact with the other end 22 of a metallic conductor 23 in the second embodiment. In this transistor in a normal operation mode, an emitter current must flow to an external terminal 10E through an emitter layer 2B and an Al emitter electrode 4B. Therefore, an urging means is preferably provided to keep the other end 22 of the metallic conductor 23 in contact with the Al emitter electrode 4B without failure.

FIG. 5 shows a fourth embodiment of the present invention. FIG. 5 shows a transistor wherein an Al emitter electrode 4 is connected to a terminal block 9E via a metallic wire 12, and the potential of the other end 22 of a metallic conductor 23 extending from an external emitter terminal 10E is substantially equal to that of the Al emitter electrode 4, however, a gap is formed between the other end 22 and an Al base electrode 5 having a potential different from that of the other end 22. More specifically, in this transistor, the gap is formed so that the electrical insulation between the other end 22 and the Al base electrode 5 is kept in a normal operation mode, and electrical conduction between the other end 22 and the Al base electrode 5 is achieved when only a metallic wire 12 is fused upon failure. In this embodiment, when the width of a gap 24 between the other end 22 and the Al base electrode 5 was set to be about several tens $\mu m$, e.g., 30 to 100 $\mu m$, a desired result could be obtained. This gap which represent a capacitance is determined in accordance with a surface area of the other end 22 of the metallic conductor 23 opposing the Al base electrode 5. If a small gap is present, when the metallic wire is fused due to a failed current and, e.g., a voltage of 100 V or more is applied, a current flows through the gap due to discharging. Thereafter, a current flows without causing any significant damage. This embodiment can be applied to another semiconductor device wherein the difference between the potential of the other end 22 of the metallic conductor 23 and that of the Al base electrode 5 formed while keeping the gap with respect to the end 22 is about several V or less in a normal operation mode, and a metallic electrode which can serve as a bypass current path of an excessive current upon failure is provided.

FIG. 6 shows a fifth embodiment of the present invention. FIG. 6 shows a transistor wherein a substantially planar metallic plate 25 is placed on electrodes 4 and 5 on a semiconductor substrate 1, and the other end 22 of a metallic conductor 23 is in contact with the metallic plate 25. In this embodiment, a sufficiently large notch 30 not in contact with an Al base electrode 5 and a metallic wire 13 for base connection, and notches through which metallic wires 12 for emitter connection can pass are formed in the metallic plate 25. A peripheral portion of the metallic plate 25 is placed on Al emitter electrodes 4A and 4B. The entire surface of the metallic plate 25 may be in contact with the Al emitter electrodes 4A and 4B, and a gap may be formed between the metallic plate 25 and the electrodes 4A and 4B, as a matter of course. In order to prevent offset of the position of the metallic plate 25, the metallic plate 25 may be fixed to the Al emitter electrodes 4A and 4B with an adhesive, as will be described later in a seventh embodiment. Note that a part of the metallic plate 25 itself may be connected as the metallic conductor 23 to a metallic terminal 10E. For example, the other end 22 may be fixed to the metallic plate 25 by, e.g., soldering, and the metallic plate 25 may serve as the other end of the metallic conductor 23.

In this embodiment, a practical contact area between the metallic conductor 23 and the Al emitter electrodes 4A and 4B is increased, and a uniform density distribution of excessive current upon failure is achieved. Therefore, a secondary accident due to local heating or the like in elements can be prevented, and the function and effect of the metallic conductor serving as an original bypass current path can be obtained with higher reliability.

Figure 7:
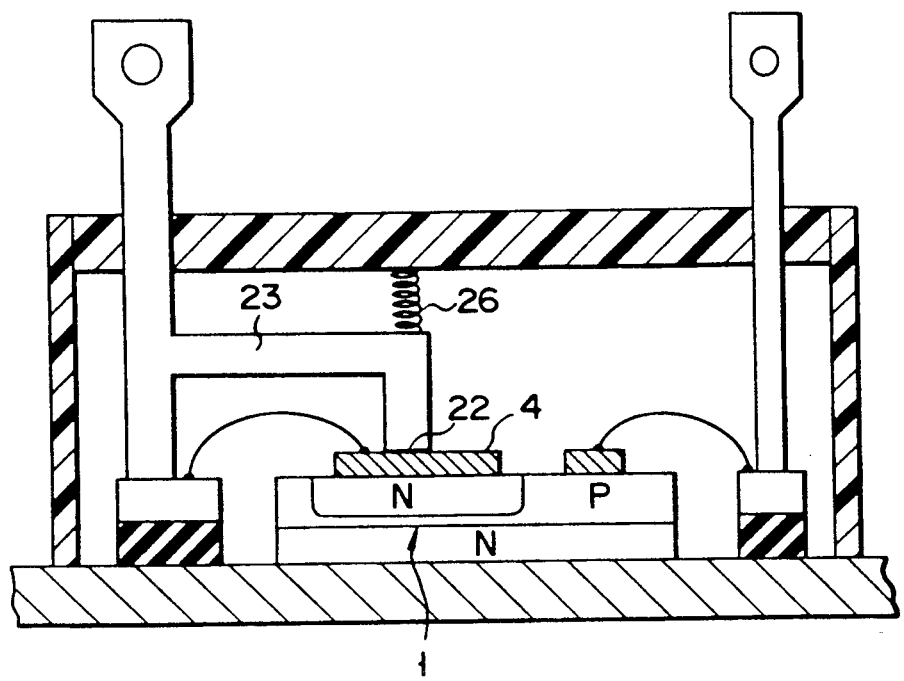

FIG. 7 shows a sixth embodiment of the present invention. In FIG. 7, a metallic conductor 23 is pressed downward by a spring 26. The other end 22 is urged against an Al emitter electrode 4 on a semiconductor substrate 1 to achieve reliable contact therebetween. As described above, this contact may be light. A spring is not limited to a spring 26 shown in FIG. 7, and a simple urging means may be employed. Various simple urging means such as a means which causes the other end to contact with the electrode using a metallic conductor 23 or a part thereof as an elastic metal piece can be considered.

Figure 8:
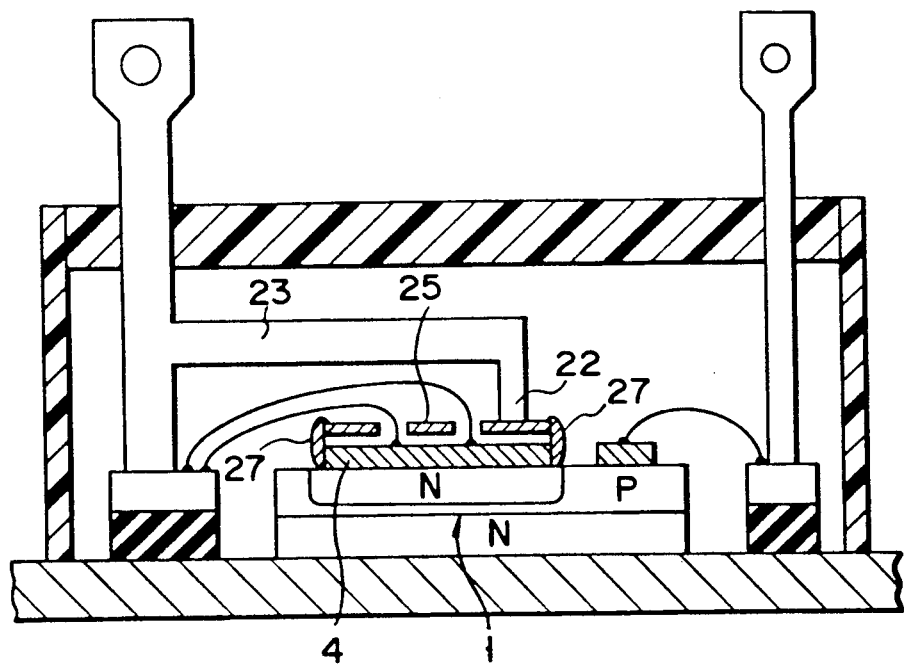

FIG. 8 shows a seventh embodiment of the present invention. In this embodiment, a transistor wherein a metallic plate 25 and the other end 22 of a metallic conductor 23 in the fifth embodiment are fixed to a semiconductor substrate 1 including a metallic electrode 4 using an adhesive 27 is exemplified.

Means for achieving the objects of the present invention in the above-described first to seventh embodiments may be independently used, or a plurality of such means may be combined. Whether to use a single means or a combination of a plurality of means is determined in consideration of the structure of the semiconductor device, manufacturing conditions, productivity including a cost, and the like.

Although a power n-p-n bipolar transistor is exemplified in the above embodiments, the present invention can be applied to a semiconductor device wherein a metallic terminal is connected to an electrode on a semiconductor substrate via a metallic wire, and the wire is fused due to an excessive current upon failure to generate an arc, among semiconductor devices on which a p-n-p bipolar transistor, a MOS transistor, an IGBT, a thyristor, a diode, or the like, or a plurality of these elements are mounted, as a matter of course.

What is claimed is:

1. A semiconductor device comprising:
   a metal base;
   a semiconductor substrate provided on said metal base and forming a semiconductor element region;
   a metallic electrode formed on said semiconductor substrate;
   a metallic terminal formed on an insulating material on said metal base;
   a metallic wire connected to said metallic electrode and to said metallic terminal for electrically connecting said metallic electrode to said metallic terminal; and
   a flat metallic conductive member, one end of which is electrically connected to said metallic terminal and the other end of which abuts said metallic electrode, for providing an alternate conductive path and thereby preventing an arc in the event said metallic wire separates, said metallic conductive member having a current capacity larger than that of said metallic wire.

2. A semiconductor device comprising:
   a metal base;
   a semiconductor substrate provided on said metal base and forming a semiconductor element region;
   a metallic electrode formed on said semiconductor substrate;

a metallic terminal formed on an insulating material on said metal base;

a metallic wire connected to said metallic electrode and to said metallic terminal for electrically connecting said metallic electrode to said metallic terminal; and a flat metallic conductive member, one end of which is electrically connected to said metallic terminal and a surface of the other end of which is spaced a predetermined gap and disconnected from an upper surface of said metallic electrode, for providing an alternate conductive path and thereby preventing an arc in the event said metallic wire separates, said metallic conductive member having a current capacity larger than that of said metallic wire.

3. A device according to claim 1, wherein said other end of said metallic conductor is kept in contact with an upper surface of said metallic electrode by urging means.

4. A device according to claim 2, wherein the size of the gap between the surface of said other end of said metallic conductor and the upper surface of said metallic electrode is determined as a function of a surface area of said other end of said metallic conductor.

5. A semiconductor device comprising:

a metal base;

a semiconductor substrate provided on said metal base and forming separated semiconductor regions;

first and second metallic electrodes separately formed on said semiconductor substrate;

a metallic terminal formed on an insulating material on said metal base;

a metallic wire connected to said first or second metallic electrode and to said metallic terminal for electrically connecting said metallic terminal to said first or second metallic electrode; and a flat metallic conductive member, one end of which is electrically connected to said metallic terminal and the other end of which abuts said first or second metallic electrode to which said metallic wire is not connected, for providing an alternate conductive path and thereby preventing an arc in the event said metallic wire separates, said metallic conductive member having a current capacity larger than that of said metallic wire.

* * * * *